(12) United States Patent
Sakamoto et al.

(10) Patent No.: US 8,044,439 B2
(45) Date of Patent: Oct. 25, 2011

(54) LIGHT-EMITTING DEVICE AND MANUFACTURING METHOD OF THE SAME

(75) Inventors: Ryo Sakamoto, Chiyoda-ku (JP); Masatoshi Iwata, Chiyoda-ku (JP); Susumu Tsujikawa, Chiyoda-ku (JP); Yoshiyuki Kobayashi, Chiyoda-ku (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 352 days.

(21) Appl. No.: 12/088,983

(22) PCT Filed: Sep. 28, 2006

(86) PCT No.: PCT/JP2006/319360
§ 371 (c)(1),
(2), (4) Date: Jul. 29, 2009

(87) PCT Pub. No.: WO2007/040149
PCT Pub. Date: Apr. 12, 2007

(65) Prior Publication Data
US 2009/0278163 A1    Nov. 12, 2009

(30) Foreign Application Priority Data
Oct. 3, 2005    (JP) .................................. 2005-290591

(51) Int. Cl.
*H01L 27/148* (2006.01)
(52) U.S. Cl. ............ 257/228; 257/21; 257/82; 257/431; 257/E33.001; 257/E51.018; 257/E31.105
(58) Field of Classification Search ............... 257/21, 257/82, 228, 431, E33.001, E51.018, E31.105
See application file for complete search history.

(56) References Cited

U.S. PATENT DOCUMENTS
5,717,226 A * 2/1998 Lee et al. ................. 257/86
6,735,230 B1    5/2004 Tanabe et al.
6,797,990 B2 * 9/2004 Udagawa ................. 257/102

FOREIGN PATENT DOCUMENTS
JP    05-175615 A    7/1993
JP    2000-022204 A    1/2000
(Continued)

OTHER PUBLICATIONS

International Search Report (ISR) for PCT/JP2006/319360 for Examiner consideration, citing foreign references Nos. 1-3 listed above.
PCT/ISA/237 in PCT/JP2006/319360 and its translation of Section V.

(Continued)

*Primary Examiner* — Michelle Estrada
(74) *Attorney, Agent, or Firm* — Chen Yoshimura LLP

(57)    ABSTRACT

A light-emitting device (1) is provided having a current blocking layer (9) of buried structure, a portion of the current blocking layer (9) having an oxygen concentration higher than that of a light-emitting layer, the current blocking layer being of a thickness of not less than 5 nm and not more than 100 nm. It includes an etching stop layer (24) below the current blocking layer (9), the etching stop layer being good in oxidation resistance. The light-emitting device (1) and its manufacturing method are provided such that the device has its current confinement effect improved and its output increased at lower forward voltage.

7 Claims, 9 Drawing Sheets

FOREIGN PATENT DOCUMENTS

| | | |
|---|---|---|
| JP | 2001-044501 A | 2/2001 |
| JP | 2003-008142 A | 1/2003 |
| JP | 3406907 B | 5/2003 |
| JP | 2003-198061 A | 7/2003 |
| JP | 3638515 B | 4/2005 |
| WO | 00-16455 A | 3/2000 |

OTHER PUBLICATIONS

Translation of PCT/ISA/237, IB338, and IB373 of PCT/JP2006/319360.

Machine translation of JP2003-198061, which has been submitted in a previous IDS on Apr. 2, 2008.

* cited by examiner

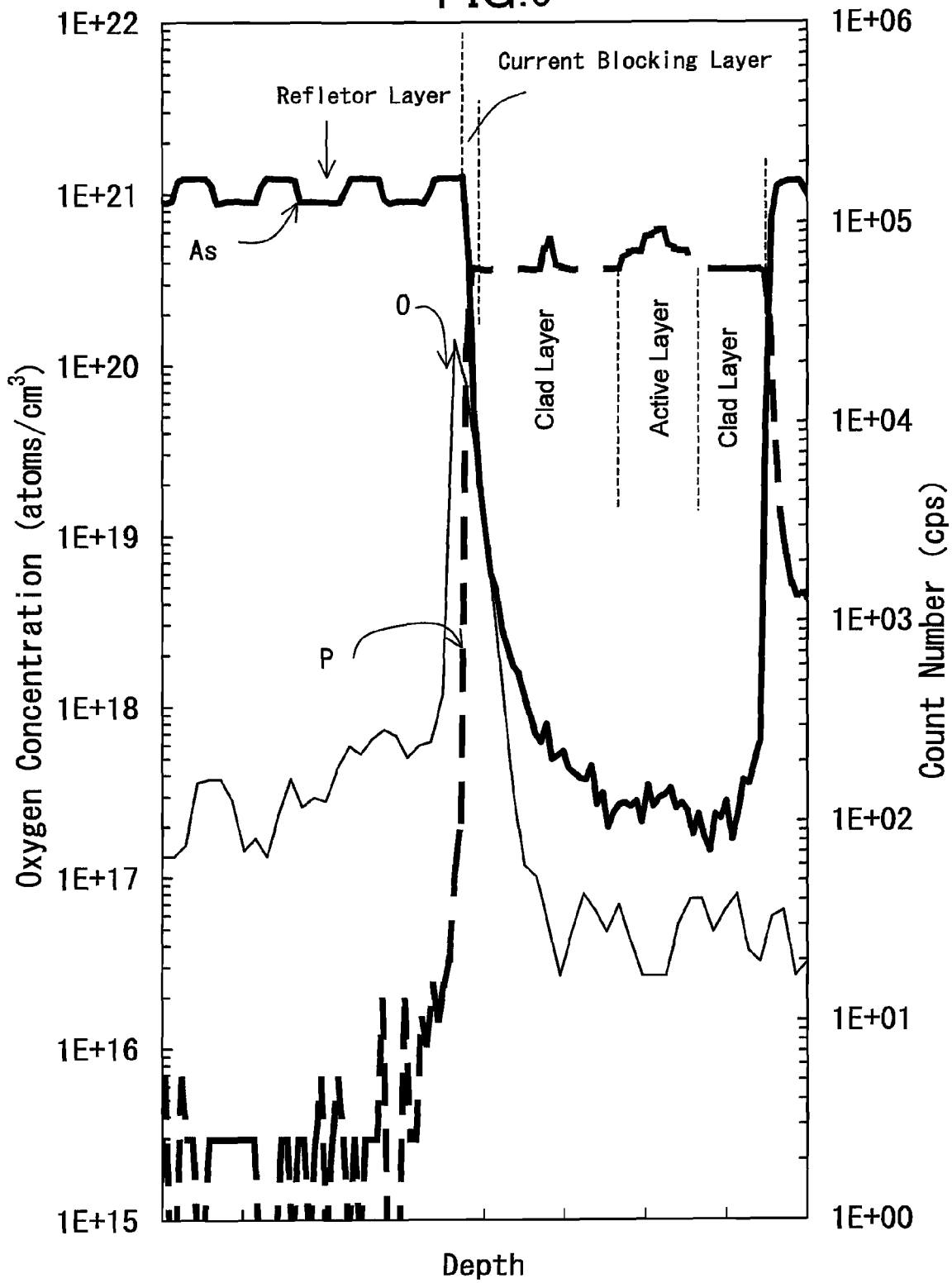

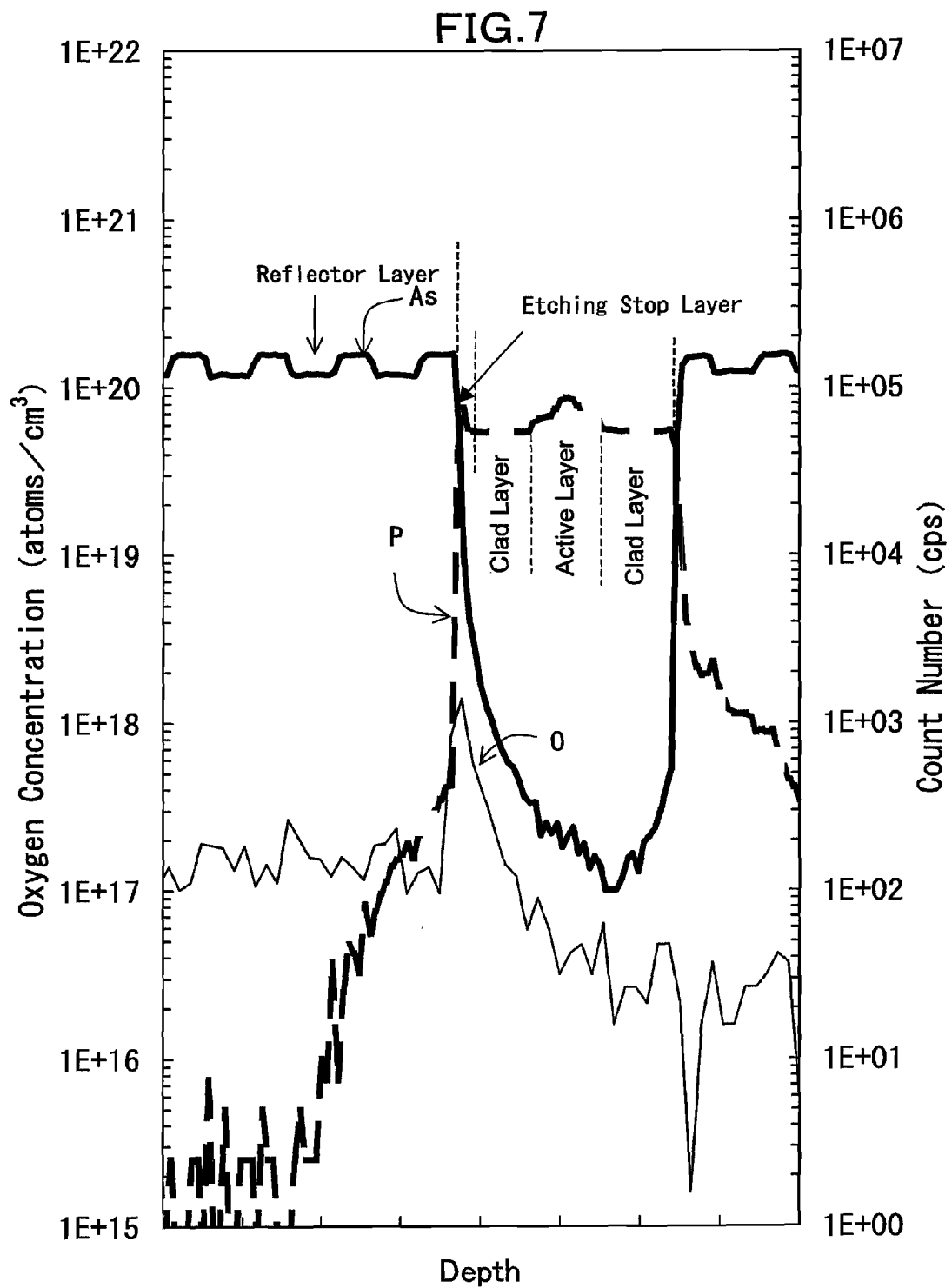

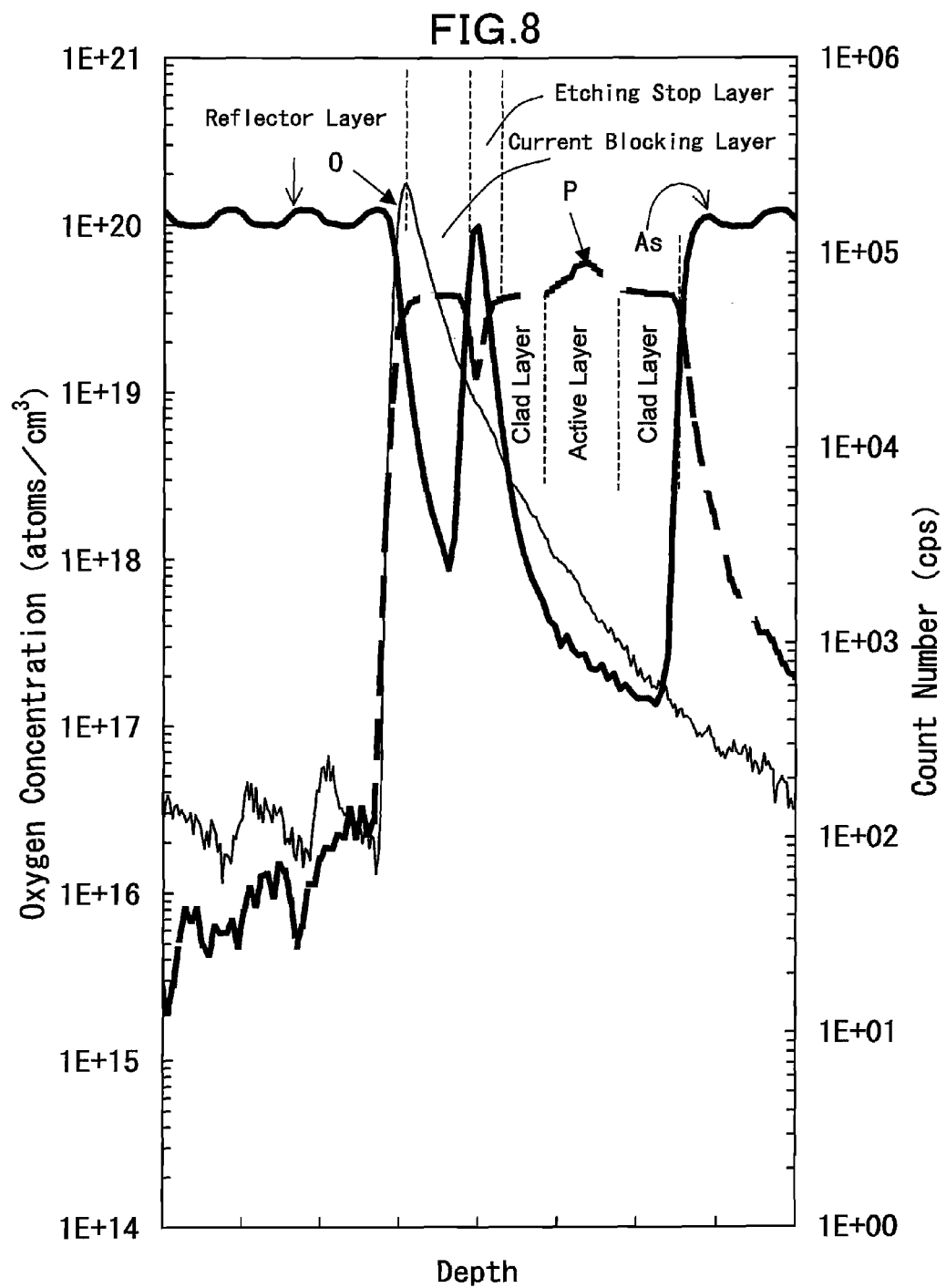

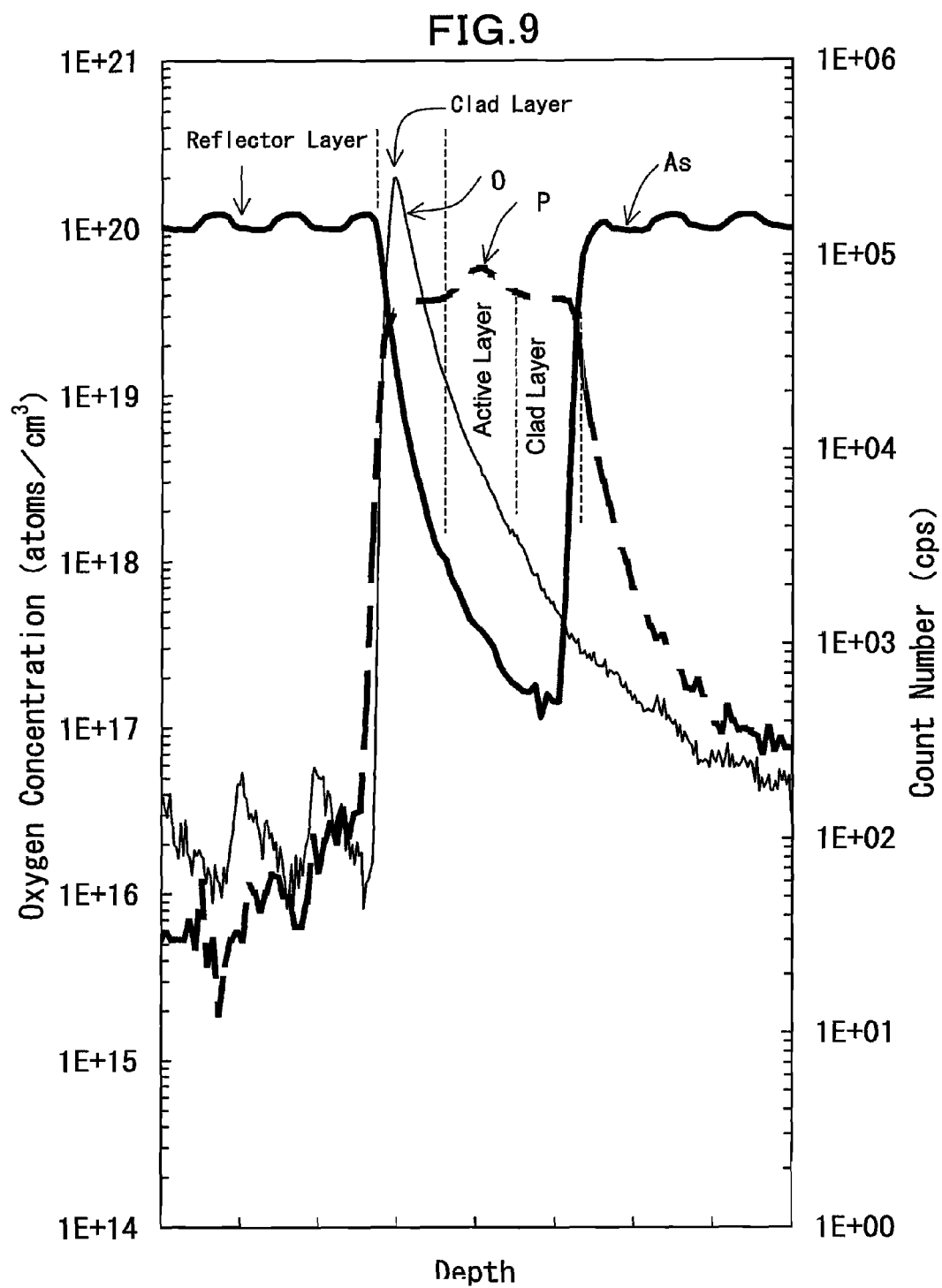

LIGHT-EMITTING DEVICE AND MANUFACTURING METHOD OF THE SAME

TECHNICAL FIELD

The present invention relates to a light-emitting device composed of semiconductors and manufacturing method of the same and more specifically to a light-emitting device having a current blocking layer and a manufacturing method of the same.

BACKGROUND ART

A light-emitting device of current confinement structure has been realized having an increased output and a high speed characteristics, and in order to confine the emitting region of in a light-emitting device, this device has been provided a current blocking layer which has a high resistive region etc. and increases the carrier densities of a part of an active layer.

In order to make the output higher and the response more higher of the light-emitting device of current confinement structure, a vertical resonator type of light-emitting device is used having a resonator structure that causes light to resonate and with a current confinement structure to increase the current density of the active layer.

As a technique to fabricate the current confinement structure in a light-emitting device, there have been known, e.g., ion implantation, impurity diffusion, selective oxidation and burying methods.

Patent Reference 1 discloses a light-emitting device having a current confinement structure of a high resistant area that is formed by implanting accelerated hydrogen (H) ions into the light-emitting device from surface or side face thereof. In this ion implantation method, damages have been introduced to crystal by this method and the reliability was deteriorated.

Patent Reference 2 discloses a light-emitting device having a current confinement structure in which a current conducting area is provided by implantation of zinc (Zn) ions from a surface of the device and diffusing them into a high resistance area to inverse its conduction-type. In this impurity diffusion method, the concentration of carriers in the region of an active layer has been changed when electrically conducting so that the light output has been unstable, since the impurity that has a large diffusion coefficient has been diffused.

Patent Reference 3 discloses a light-emitting device of a current confinement structure which is fabricated by oxidizing a layer that is large in percentage composition of aluminum (Al) from a side face of the device when heat treated in a water vapor atmosphere. In this selective oxidation method, the control of the oxygen content was difficult. Since the layer of high Al content has been changed its volume and the distortion was introduced to the crystal, the reliability was deteriorated.

Patent References 4 and 5 disclose a light-emitting device of a current confinement structure in which a current blocking layer is locally buried in the device using a forbidden band gap barrier of pn junction. Further, Patent Reference 5 discloses a light-emitting device having an etching stop layer.
Patent Reference 1: JP 3638515 B
Patent Reference 2: JP 2001-44501 A
Patent Reference 3: JP 2003-8142 A
Patent Reference 4: JP 3406907 B
Patent Reference 5: JP H05-175615 A

DISCLOSURE OF THE INVENTION

Problems to be Solved by the Invention

In the burying methods disclosed in Patent References 4 and 5 in which the current blocking layer can easily be controlled in width and thickness and which does not require the heat treatment and ion implantation and hence is free from impurities diffused into or applying distortions to the active layer, it is possible to make a light-emitting device that is high in reliability. However, in the current confinement structure disclosed in Patent Reference 4, an oxide film was formed at its opening portion during etching of the current blocking layer. As a result, the forward voltage of the light-emitting device, which has re-grown layers of the device structure onto the oxide film of the opening portion, became higher.

When the current confinement structure disclosed in Patent Reference 5 is fabricated, the heat treatment is necessarily done in an As atmosphere to remove an natural oxide film formed on a GaAs etching stop layer. This may cause a dopant such as in a clad layer to be diffused into the active layer, thus deteriorating the device output. Such deterioration of the output is noticeable especially when a quantum well structure is adopted as the active layer.

In order to achieve sufficient current confinement effect using a p-n junction or a band gap difference between forbidden bands, a current blocking layer fabricated by the burying method needs to have its thickness increased to as thick as 1 μm. If the thickness of the current blocking layer is increased, a surface irregularity may then be created on a semiconductor layer above the current blocking layer. Also, it takes a prolonged time to chemically etch the current blocking layer. The current blocking layer is etched not only depthwise but diametrically direction and a surface irregularity tends to develop variations in the electric field distribution. Hence, there also arises the problem that a diode having a high output power and a low forward voltage is hard to be obtained.

In view of the problems mentioned above, it is a first object of the present invention to provide a light-emitting device in which its active layer is protected against oxidation by making an etching stop layer oxidation resistant while the current confinement effect is improved, thereby allowing a higher output power to be achieved with a lower forward voltage. It is a second object of the present invention to provide a manufacturing method such a light-emitting device at good yield.

Means for Solving the Problems

As a result of their researches zealously repeated on a light-emitting device having a current blocking layer, the present inventors have acquired the knowledge that if at least a portion of the current blocking layer is oxidized and an etching stop layer is made oxidation resistant, it is possible to fabricate the current blocking layer that remains thin without raising the resistance of re-grown surfaces and in turn to make a light-emitting device providing a higher output power with a lower forward voltage.

In order to attain the first object mentioned above, there is provided a light-emitting device comprising a light-emitting layer and a current blocking layer, characterized in that it has the current blocking layer of a buried structure and a portion of the current blocking layer having an oxygen concentration higher than that of the light-emitting layer, the current blocking layer being of a thickness of not less than 5 nm and not more than 100 nm.

There is an etching stop layer preferably beneath the current blocking layer.

At least the portion of the current blocking layer has an oxygen concentration preferably of not less than $1 \times 10^{20}$ atoms/cm$^3$. The current blocking layer is preferably composed of a semiconductor of a III-V group compound in which aluminum is present at a percentage composition of not less than 30 mole percent of III group elements.

According to the structure mentioned above, oxidizing at least a portion of the current blocking layer to raise its resistance allows making the current blocking layer thin. If its thickness is not less than 5 nm and not more than 100 nm, the current confinement effect has been found to become outstanding. Further, the irregularity of the semiconductor layer formed above the current blocking layer can be alleviated, and the current blocking layer can be chemically etched in a reduced period of time while preventing etching in the diametrical direction to restrain variation in electric field distribution.

A surface area of the etching stop layer where the current blocking layer is opened has an oxygen concentration, preferably, of not more than $1 \times 10^{19}$ atoms/cm$^3$. The etching stop layer is composed of a semiconductor of a III-V group compound in which aluminum is present at a percentage composition of not less than 10 mole percent of III group elements. The current blocking layer has an oxygen concentration, preferably, at least 100 times of that of a surface area of the etching stop layer where the current blocking layer is opened.

According to the structure mentioned above, the etching stop layer can be prevented from oxidation in the step of etching the current blocking layer. As a result, the forward voltage can be reduced while creating the least resistance in a light-emitting device as well having a semiconductor grown on the etching stop layer.

Further, a light-emitting device if equipped with a resonator structure can provide a high output power with a high response speed. Thus, a light-emitting device of vertical resonator type can be provided having such properties and also high in directivity.

In order to attain the second object mentioned above, a manufacturing method of a light-emitting device in accordance with the present invention, characterized in that it comprises: a first step of building up an oxidation resistant etching stop layer and a current blocking layer; a second step of partially etching the current blocking layer, wherein the second step includes enhancing oxygen concentration in a portion of the current blocking layer and also includes the further step of burying the current blocking layer in the light-emitting device.

In the method mentioned above, at least a portion of said current blocking layer has the concentration of oxygen raised to not less than $1 \times 10^{20}$ atoms/cm$^3$.

According to the method mentioned above, it is possible to selectively etch the current blocking and etching stop layers together and to raise the resistance at a surface of the current blocking layer. This permits a light-emitting device such as of vertical resonator type providing an increased output at high reliability and rapid response to be manufactured at an enhanced yield.

Effects of the Invention

The present invention provides a light-emitting device having a current blocking layer and an oxidation resistant etching stop layer disposed adjacent thereto which can prevent a surface area thereof from being oxidized where crystal is re-grown while the blocking layer is being etched. Also, the manufacturing yield of devices can be improved by fabricating the thin current blocking layer.

BRIEF DESCRIPTION OF THE DRAWINGS

In the drawings:

FIG. 6 is a graph illustrating results of secondary ion mass spectrometry taken for a vertical resonator type light-emitting device of Example 1 in the direction of a depth from its surface in a region across its current blocking layer;

FIG. 7 is a graph illustrating results of Secondary Ion-microprobe Mass Spectrometry taken for the vertical resonator type light-emitting device of Example 1 in the direction of a depth from its surface in a region across an opening portion of the current blocking layer;

FIG. 8 is a graph illustrating results of secondary ion mass spectrometry taken for a vertical resonator type light-emitting device of Comparative Example 2 in the direction of a depth from its surface in a region across its current blocking layer; and FIG. 9 is a graph illustrating results of secondary ion mass spectrometry taken for the vertical resonator type light-emitting device of Comparative Example 2 in the direction of a depth from its surface in a region across an opening portion of the current blocking layer,

Figure 1:
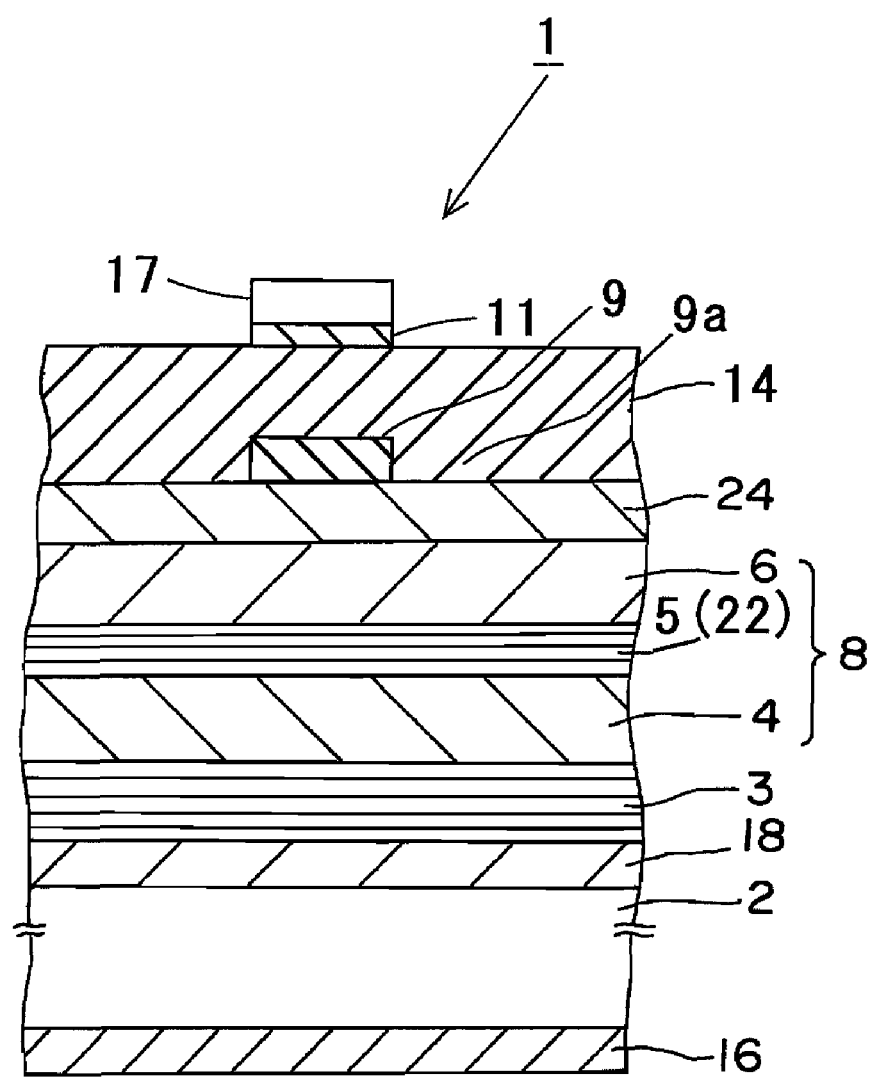
FIG. 1 is a view illustrating a cross sectional structure of a light-emitting device according to a first form of implementation of the present invention.

| Explanation of the Reference Characters | |
|---|---|
| 1: | Light-emitting device |
| 2: | n-type substrate |
| 3: | First reflector layer of n-type |
| 4: | First clad layer of n-type |
| 5: | Active layer |
| 6: | Second clad layer of p-type |
| 8: | Double heterojunction (light-emitting region) |
| 9: | Current blocking layer |
| 10: | Second reflector layer of p-type |
| 11: | Contact layer |
| 12: | Passivation layer |
| 13: | Light emitting window portion |
| 14: | p-type semiconductor layer |
| 15: | Dicing region |
| 16, 17: | Electrode |
| 18: | Buffer layer |
| 19: | GaAs cap layer |
| 19A: | High resistant region |
| 20, 20A: | Vertical resonator light-emitting device |
| 21: | Recess |
| 22: | Active layer of quantum well structure |
| 24: | Etching stop layer |
| 25: | Recess |

BEST MODES FOR CARRYING OUT THE INVENTION

Explanation is given hereinafter of forms of implementation of the present invention with reference to the Drawing Figures. In the Figures, the same reference characters are used to designate the same or corresponding components.

FIG. 1 is a view illustrating a cross sectional structure of a light-emitting device according to a first form of implementation of the present invention. As shown in FIG. 1, a light-emitting device 1 of the present invention has a substrate 2 of n-type above which it includes an n-type first clad layer 4, an active layer 5 constituting a light-emitting layer, a p-type second clad layer 6 and a p-type etching stop layer 24 which are built up in turn. A p-type semiconductor layer 14 is formed on a part of the etching stop layer 24. A p-type semiconductor layer 14 is deposited on the etching stop layer 24 where the current blocking layer 9 is not formed (hereinafter, referred to conveniently as an "opening portion 9a" and above the current blocking layer 9. The light-emitting device 1 has a structure so called a buried structure that the current blocking layer 9 is buried in the p-type semiconductor layer. A contact layer 11 is formed on the p-type semiconductor layer 14 and above the current blocking layer 9. An electrode 17 is formed on the contact layer 11. The contact layer 11 can be a p-type semiconductor layer having high impurity density. An electrode 16 is formed under the substrate 2a.

Here, as shown in FIG. 1 the light-emitting device 1 may be provided with a reflector layer 3 on the side of the substrate 2 to externally emit light efficiently. A buffer layer 18 may be inserted between the substrate 2 and the reflector layer 3.

The first clad layer 4, the active layer 5 and the second clad layer 6 are provided to constitute a double heterojunction structure, and the active layer 5 is a region to act as the light-emitting layer. The p-type semiconductor layer 14 is formed on the current blocking layer 9 and on the opening portion 9a of the current blocking layer 9 to allow passing current from the electrode 17 into the active layer 5. Since the current blocking layer 9 is thus designed to be in the buried structure, the contact layer 11 is allowed to contact with the p-type semiconductor layer 14 of low resistance in an increased area to make even the current density in a contact area between the electrode 7 and the p-type semiconductor layer 14.

In the structural configuration, the opening portion 9a of the current blocking layer 9 provides a current path in the light-emitting device 20. An electric current injected from the electrode 17 passes through the p-type semiconductor layer 14 towards the opening portion 9a of the current blocking layer 9 and it provides a high current density in the opening portion 9a of the current blocking layer 9. The light-emitting device 1 provides an increased output with a rapid response, since the current with high density flows into the active layer 5 under the opening portion 9a of the current blocking layer 9. Also, the light can be emitted efficiently, since the electrode 17 is formed above the p-type semiconductor layer 14 and right above the current blocking layer 9 and the light emitted from the active layer 5 is not absorbed by the contact layer 11.

Figure 2:
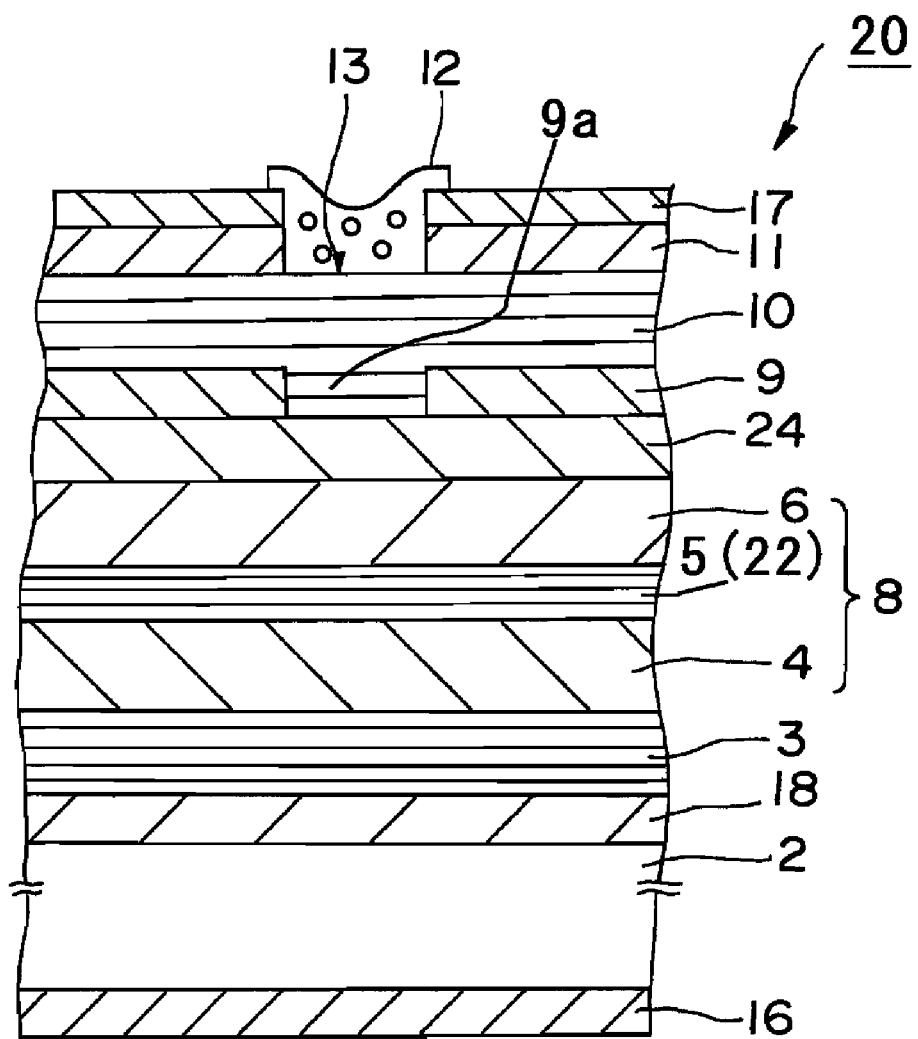
FIG. 2 is a view illustrating a cross sectional structure of a light-emitting device according to a second form of implementation of the present invention.
Figure 3:
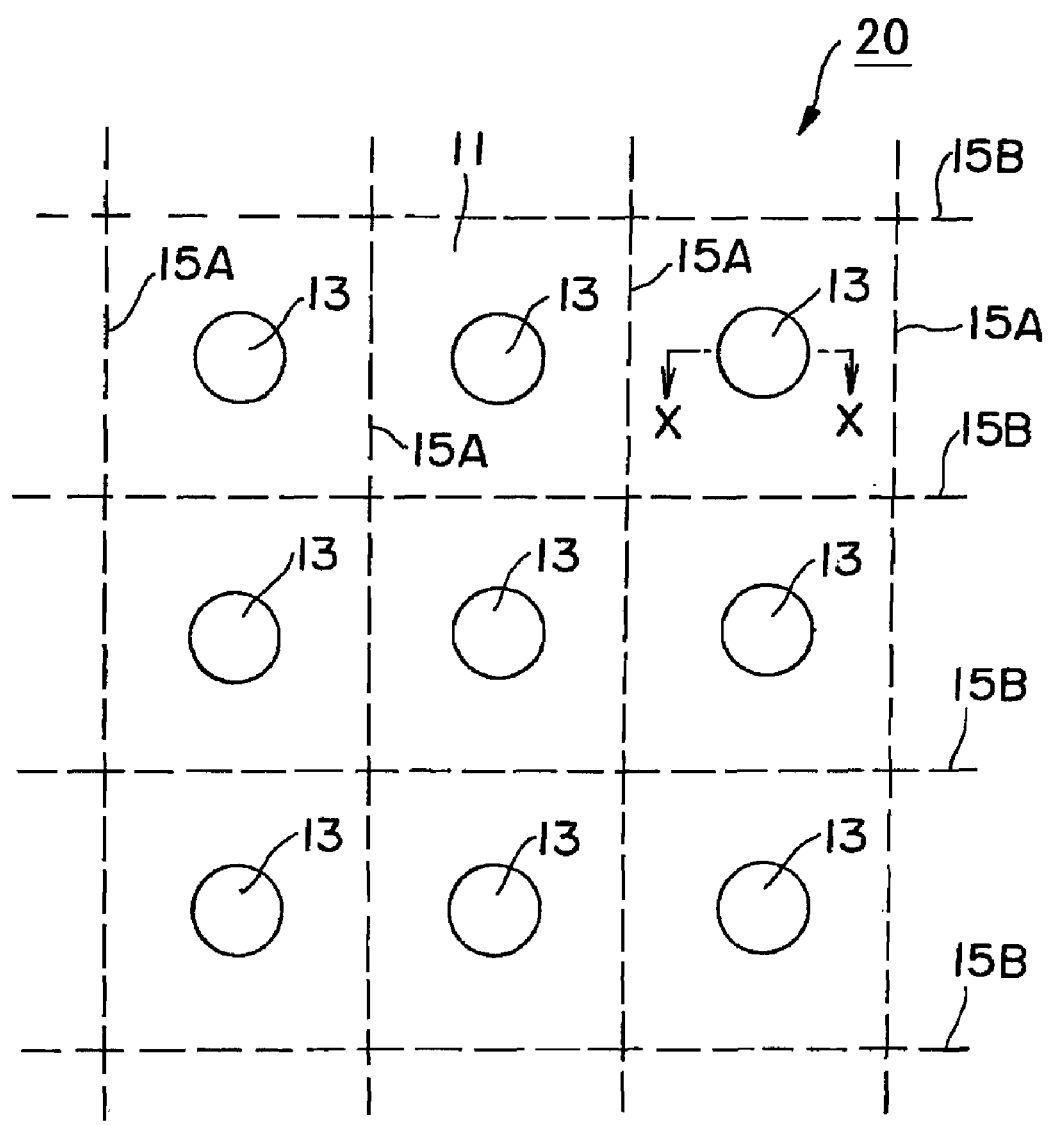
FIG. 3 is a plan view of FIG. 2.

FIG. 2 is a view illustrating a cross sectional structure of a light-emitting device 20 according to a second form of implementation of the present invention and FIG. 3 is a plan view of FIG. 2. FIG. 2 is a cross sectional view taken along the line X-X in FIG. 3.

As shown in FIG. 2, the light-emitting device 20 of vertical resonator type according to the present invention has a multi-layered structure above the n-type substrate 2 where the first n-type reflector layer 3, the first n-type clad layer 4, the active layer 5, the p-type second clad layer and the p-type etching stop layer 24 are deposited in order. Further, the current blocking layer 9 is formed on a portion of the etching stop layer 24. A second reflector layer 10 is deposited above the current blocking layer 9 and the opening portion 9a of the current blocking layer 9. The current blocking layer 9 is buried in the light-emitting device 20. The contact layer 11 and the electrode 17 are formed by depositions on the second reflector layer 10 and above the current blocking layer 9. A passivation film 12 composed of an insulating material is formed on a light emitting window portion 13 where the contact layer 11 on the second reflector layer 10 is not formed. Also, the electrode 16 is formed beneath the substrate 2.

In the vertical resonator type light-emitting device 20, a vertical resonator is constituted by the first reflector layer 3 and the second reflector layer 10. This vertical resonator has a length corresponding to the spacing between the first and second reflector layers 3 and 10 in a vertical direction on the sheet of paper, namely the sum in thickness of the layers constituting the double heterojunction 8 and the p-type etching stop layer 24.

The active layer 5 constituting the light-emitting region in the double heterojunction 8 can be an active layer 22 formed of a quantum well structure. The active layer 22 formed of quantum well structure can be formed by alternately depositing thin semiconductor layers varied in forbidden band gap and may be a single or multiple quantum well structure. With the active layer 22 formed of such a quantum well structure, the vertical resonator type light-emitting device 20 can be provided achieving a higher output power and a higher response than with the active layer 5 formed of a single layer as shown in FIG. 2.

As shown in FIG. 2, in the vertical resonator type light-emitting device 20 the light emitted at the active layer 5 is radiated from the light-emitting window portion 13. The light-emitting window portion 13 can be of any suitable shape such as a circle, ellipse or rectangle. Here, areas defined with dashed lines 15A and 15B indicate dicing areas 15. Each chip of light-emitting device 20 is separated along the dicing areas 15 as will be described later.

A Bragg reflector layer formed by depositing layers having a different index of refraction may be used as the reflector layers 3, 10. The Bragg reflector layer has the structure that a film having a relatively high index of refraction $n_1$ and a thickness $\lambda/4n_1$ and a film having a relatively low index of refraction $n_2$ and a thickness $\lambda/4n_2$ are alternately deposited.

Here, $\lambda$ is an emission wavelength of the vertical resonator type light-emitting device 20. Of the reflector layers 3 and 10 shown in FIG. 2, the reflector layer 3 reflects a component of light emitting from the active layer 5 towards the substrate 2 to the obverse side of the substrate 2. The reflector layer 3 has a function to raise the light extracting efficiency. And, by raising the reflectance of the reflector layer 3 on the side of the substrate 2 higher than that of the upper reflector layer 10, the light emitted at the active layer 5 can be extracted selectively from the upper reflector layer 10.

Used in the reflector layer 3, 10, the layers of high and low indexes of refraction can be, e.g., $Al_rGa_{1-r}As$ (where r for Al composition: $0<r<1$) and AlAs, respectively. And, the reflector layer 3, 10 in which they are alternately deposited may be designated as $Al_rGa_{1-r}As/AlAs$.

In a combination of the layers of high and low refractive indexes, AlAs of the low refractive index layer can be substituted with $Al_sGa_{1-s}As$ (where s for Al composition: $0<s<1$) while the high refractive index layer can be made of $Al_rGa_{1-r}As$.

Moreover, the buffer layer 18 as shown in FIG. 2 may be interposed between the substrate 2 and the first reflector layer 3. The first reflector layer 3 with high crystal quality can be formed by insertion of the buffer layer 18.

In the light-emitting device 1, 20 according to the present invention, it is preferred that the etching stop layer 24 may be composed of an oxidation resistant material, i.e., a material hard to be oxidized. This allows restraining an oxide film from being formed on a surface of the etching stop layer 24 where the current blocking layer 9 is opened, i.e., a re-grown surface constituting the current path as will be described later, and thus can limit a rise in the forward voltage. If the light-emitting device 1, 20 is constituted by a III-V group compound semiconductor as a compound of a III group element and a V group element (hereinafter, referred to as a III-V compound light-emitting device), the etching stop layer 24 is preferably composed of a mixed crystal in which the percentage composition of Aluminum (Al) is not more than 10 mole percent in the III element composition. More preferably, the etching stop layer 24 is composed of a mixed crystal that is free from Al, which is easily oxidized in the mixed crystal composition. For example, if the etching stop layer has a phosphorus (P) as the V group element, its composition can be $Al_xGa_yIn_{1-x-y}P$ (where $0 \leq x \leq -0.1$, $0 \leq y \leq 1$ and $0 \leq x+y \leq 1$). It is then preferred that x=0, viz., that $In_yGa_{1-y}P$ (where $0<y<1$) is the composition. Advantageously, the oxygen concentration in an interface between the etching stop layer 24 and a semiconductor layer grown after the current blocking layer 9 is etched, namely in a re-grown surface area of the etching stop layer 24 is not more than $1 \times 10^{19}$ atoms/cm$^3$.

It is desirable that the composition of the etching stop layer 24 ($Al_xGa_yIn_{1-x-y}P$ or $In_yGa_{1-y}P$) may be composed so as to be lattice matched with the clad layer 6 made of $Al_xIn_{1-x}P$ (where $0<x<1$). When the current blocking layer 9 is etched as will be described later, the etching stop layer 24 may suffice to have a thickness to protect the second clad layer 6 lying beneath the etching stop layer 24. By adjusting a thickness of etching stop layer 24 to be not more than 30 nm, preferably not more than 10 nm, the absorption of emission from the active layer 5 may be decreased and the emission may be extracted more effectively.

In the light-emitting device 1, 20 according to the present invention, the current blocking layer 9 can be selectively etched together with the etching stop layer 24 and is preferably composed of an easily oxidized material. To wit, the current blocking layer 9 may preferably be a structure that at least a portion thereof has been oxidized. By oxidizing a portion of the current blocking layer 9, it becomes possible to be a high resistive layer, thereby enhancing the current blocking capability. Thus, by oxidizing a portion of the current blocking layer 9, it is made possible to fabricate the thin current blocking layer 9.

The current blocking layer 9 preferably has a thickness of not less than 5 nm and not more than 200 nm. It is possible that the oxidizing the current blocking layer 9 has a current blocking effect even if its thickness is reduced to as thin as 5 nm. With the thickness of the current blocking layer 9 more than 200 nm, re-growth of the second reflector layer 10 becomes hard to be controllable in shape and the forward voltage becomes high undesirably. Further preferably, the current blocking layer 9 may provide a good current confinement effect if it is oxidized in part and its thickness is not more than 100 nm. Especially, if the thickness of the current blocking layer is reduced to not more than 25 nm, the forward voltage will be lowered, thereby improving the crystal quality of a film deposited thereon and enhancing the yield of devices.

The current blocking layer 9 in the case of III-V group light-emitting device may contain aluminum (Al) at a proportion not less than 30 mole % of the III group element composition. For example, if the current blocking layer 9 has phosphorus (P) as a V group element, it is preferred that it has composition $Al_xGa_yIn_{1-x-y}P$ (where $0.3 \leq x \leq 1$, $0 \leq y \leq 1$ and $0 \leq x+y \leq 1$) to oxidize its surface and thereby to raise its resistance. Especially if the Al proportion is not less than 50%, it is then possible to obtain high current blocking effect and to selectively etch the layer 9 together with the etching stop layer 24.

If at least a portion of the current blocking layer 9 has an oxygen concentration of not less than $10^{20}$ atoms/cm$^3$, it is possible to raise its resistance. In this case, the current blocking layer 9 has an oxygen concentration at least 100 times of that of a surface area of the etching stop layer 24 where the current blocking layer 9 is opened. To wit, since the surface of the etching stop layer 24 where the current blocking layer 9 is opened constitutes a path for the current, it is preferred that the oxygen concentration be not more than $1 \times 10^{18}$ atoms/cm$^3$.

By forming the current blocking layer 9 adjacently to the active layer 5 as the light-emitting layer, it is possible to flow the current through an increased area extending to a region of the current blocking layer 9, thereby achieving an enhanced current confinement effect. Especially, if the current blocking layer 9 is formed above the second clad layer 6, there is then no influence on the active layer 5 from a crystalline strain arising from the opening portion of the current blocking layer 9. In this case, the thickness of the second clad layer may preferably be not more than 25 nm and not less than 250 nm. If the second clad layer 6 has a thickness of less than 25 nm, the carrier confinement effect of the double heterojunction is reduced and the emission property is deteriorated. On the other hand, if the second clad layer 6 has a thickness of more than 250 nm, the resonance effect is lowered and the emission property is deteriorated.

In the light-emitting device 1, 20 in accordance with the present invention, the use of an oxidation resistant stopping layer 24 allows restraining the oxidation of the re-grown surface area to lower the forward voltage. Further, oxidizing the current blocking layer 9 enhances the current confinement effect to improve the emission output power and realize the quick response and further to make it possible to fabricate the current blocking layer 9 thin and to improve the yield of manufacturing the light-emission device 1, 20.

While the substrate 2 is explained to be of n-type in the forms of implementations 1 and 2 of the present invention, it may be of p-type. Then, the type of conduction of each layer above may be changed according to the substrate. While the etching stop layer 24 and the current blocking layer 9 are explained as preferably formed above the second clad layer 6, they may be formed under the first clad layer 4 to still maintain the crystal quality of the active layer 5 well since the current blocking layer 9 of the present invention can be made thin.

Next, in describing a process of manufacturing such a light-emitting device in accordance with the present invention, the vertical resonator type light-emitting device 20 as an example will be mentioned.

Figure 4:
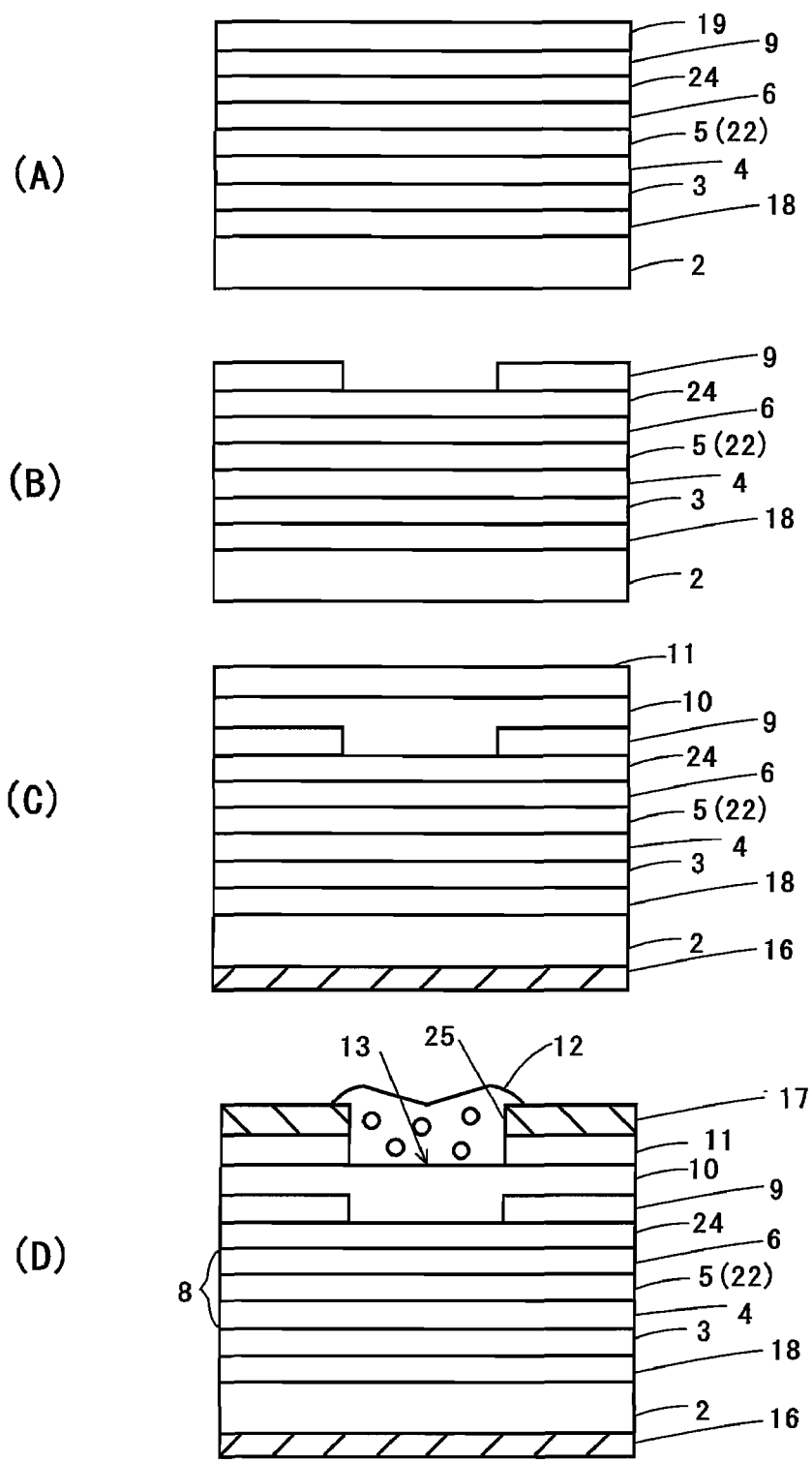
FIG. 4 is a view illustrating a process of manufacturing method of a vertical resonator type light-emitting device in accordance with the present invention.

FIG. 4 is a view illustrating a process of manufacturing a vertical resonator type light-emitting device 20 in accordance with the present invention.

As shown in FIG. 4(A), a first step of the process is a first epitaxial growth step in which semiconductor layers are deposited on a substrate 2. For example, a n-type buffer layer 18, a n-type first reflector layer 3, a n-type first clad layer 4, an active layer 5, a p-type second clad layer 6, an p-type etching stop layer 24 and a current blocking layer 9 are grown in turn on the n-type GaAs substrate 2. Here, the current blocking layer 9 which is oxidized to raise its resistance may be of any type of conduction such as n, p or non-doped type. If the composition of the current blocking layer 9 is made the same as that of the second conduction-type clad layer 6, it possible to bury the current blocking layer 9 while maintaining its crystal quality well and thus to achieve its raised current blocking effect.

Where necessary, a GaAs cap layer 19 may be formed onto the current blocking layer 9 to serve as a passivation layer.

A second step of the process is a step of etching the current blocking layer 9. As shown in FIG. 4(B), a part of the current blocking layer is removed by etching to form a region for flowing the electric current. For example, the GaAs cap layer 19 and a part of the current blocking layer 9 are removed to the etching stop layer 24 to form an opening portion. Then, the GaAs cap layer 19 remaining on the current blocking layer 9 is removed by etching to expose a surface of the current blocking layer 9. After etching as shown in FIG. 2, a recess 21 is formed becoming the opening portion of the current blocking layer 9 and a portion of the current blocking layer 9 is oxidized to raise its resistance. In the step mention above, the diffusion of dopants of the p-type clad layer 6 into the active layer 5 by the heat treatment can be prevented, since the heat treatment is not required to remove the GaAs cap layer 19. An etching liquid used to oxidize a portion of the current blocking layer 9, namely to raise its oxygen concentration, should preferably contain oxygen, active oxygen, ozone ($O_3$), hydrogen peroxide and so on.

A third step of the process is a second epitaxial growth step. As shown in FIG. 4(C), semiconductor layers are deposited onto the current blocking layer 9 and the etching stop layer 24. For example, a p-type second reflector layer 10 and a p-type contact layer 10 are grown in turn on the current blocking layer 9 and the etching stop layer 24. It should be noted that a MOCVD or MBE method can be used in the epitaxial growth in each of the first and third steps.

A fourth step of the process is an electrode forming step. As shown in FIG. 4(D), electrodes 16 and 17 and a passivation film 12 are fabricated. For example, after the electrode 17 is deposited onto the p-type contact layer 11, the electrode 17 and the p-type contact layer 11 are in part etched by photolithography to expose a surface of the p-type second reflector layer 10 and thereby to form a light emitting window portion 13. The light emitting window portion 13 is covered with the passivation film 12 made of an oxide film containing Si or nitride film. In forming the passivation film 12, there may be used, e.g. a plasma CVD method. The passivation film 12 has a thickness adjusted to $(m/4) \times (\lambda/n)$, where m is an odd number and n is the index of refraction of the passivation film. The passivation film 12 should have a high transmissivity to light. The electrode 16 is formed on the side of the substrate 2 by a sputtering method and so on.

In the above steps of the process, if the clad layer 4, 6 of double heterostructure is formed of $Al_xIn_{1-x}P$ (0<x<1) as a III-V group compound semiconductor, the etching stop layer 24 can be a mixed crystal of $Al_xIn_yGa_{1-x-y}P$ (where $0 \leq x \leq 0.1$, $0 \leq y \leq 1$ and $0 \leq x+y \leq 1$). In this case, the percentage composition of aluminum in the mixed crystal, namely x, is preferably not more than mole 10% to prevent its oxidation. Also, if the current blocking layer 9 may be $Al_xIn_{1-x}P$ (where $0.3 \leq x \leq 1$, $0 \leq y \leq 1$ and $0 \leq x+y \leq 1$) and the difference in Al percentage composition x between the etching stop layer 24 and the current blocking layer 9 is adjusted to be $x \geq 0.3$, namely not less than 30 mole %, the current blocking layer 9 can be etched selectively to the etching layer 24. This allows the current blocking layer 9 to be chemically etched in a reduced time period while preventing it from being etched in a radial direction, thereby restraining the change in electric field distribution. Moreover, it becomes possible to maintain the flatness of the current blocking layer 9 and to reduce the surface irregularity of the second reflector layer 10 and hence to form the second reflector layer 10 of an enhanced quality.

The composition of the etching stop layer 24 may be with x=0, namely be $In_yGa_{1-y}P$ (where 0<y<1). Since this mixed crystal composition is free of Al that can easily be oxidized, it is possible to prevent an oxide film from forming on a re-growing interface and to maintain its resistance with the upper second reflector layer 10 low. Such composition, namely $Al_xGa_yIn_{1-x-y}P$ or $In_yGa_{1-y}P$, of the etching stop layer 24 is desirable to be lattice matched with the clad layer 6 of $Al_xIn_{1-x}P$ (where 0<x<1).

In the current blocking layer 9, the proportion of Al in $Al_xGa_yIn_{1-x-y}P$ ($0.3 \leq x \leq 1$, $0 \leq y \leq 1$ and $0 \leq x+y \leq 1$) is preferably that the percentage composition of aluminum in the mixed crystal, namely x, be not less than 30 mole %. Especially if $x \geq 0.5$, an enhanced current confinement effect is achieved, and the current blocking layer 9 can be etched selectively to the etching layer 24.

According to the manufacturing method mentioned above, it is possible that the current blocking layer 9 can be formed on the p-type clad layer 6 by the burying technique while controlling the thickness of the current blocking layer 9 adjacent to the active layer 5. This allows flowing the current through an increased area extending to a region of the current blocking layer 9, thereby achieving an enhanced current confinement effect while increasing the current density into the active layer 5 as the light-emitting region. An increased emission intensity is thereby obtained. If the electrode 17 in contact with the p-type contact layer formed on the second reflector layer 10 is fabricated above the current blocking layer 9 in the same configuration as the latter, it is then possible to emit light efficiently.

If the etching stop layer 24 of $In_yGa_{1-y}P$ as a semiconductor layer formed between the p-type clad layer 6 and the current blocking layer 9 is made free of Al or made to contain Al at a composition x of not more than 10 mole %, there is a little residual impurity when the current blocking layer 9 is etched and it is possible to prevent oxidation of the p-type clad layer 6 that contains Al. Consequently, in the third process step above, the second reflector layer 10 can be epitaxially grown with high crystal quality, since the etching stop layer 24 needs not be removed at the epitaxial growth of the second reflector layer 10.

Further, the GaAs cap layer 19 as a passivation layer for the current blocking layer 9 may be removed by etching immediately prior to the third process step. Since the heat treatment is not required to remove the GaAs cap layer, the diffusion of the p-type dopants in clad layer 6 into the active layer 5 by the heat treatment can be prevented effectively.

According to the manufacturing method of a vertical resonator type light-emitting device 20 of the present invention, an oxidation resistant etching stop layer 24 is disposed on the clad layer 6 having second conduction-type to prevent the surface area where crystal is re-grown from being oxidized while etching. The current blocking layer 9 is fabricated thin adjacent to an active layer 5 to increase the current density into the active layer 5, thereby achieving an enhanced current confinement effect.

Example 1

Examples of vertical resonator type light-emitting device as a light-emitting device of the present invention will be explained. At the outset, the manufacturing method of a vertical resonator type light-emitting device of Example 1 will be mentioned.

First, in the first process step, the MOCVD method was used to grow the following layers in order as the first-time epitaxial growth layers onto a GaAs substrate 2:

100 nm of a n-type GaAs buffer layer 18, 1995 nm of a first reflector layer 3 consisting of 20.5 pairs of $Al_{0.45}Ga_{0.55}As$ (45 nm)/AlAs (52.5 nm), an n-$Al_{0.5}In_{0.5}P$ clad layer 4, three pairs of multiple quantum well layers 22 consisting of InGaP and AlGaInP, a p-type $Al_{0.5}In_{0.5}P$ clad layer 6, 10 nm of a p-type $In_{0.5}Ga_{0.5}P$ etching stop layer 24, 100 nm of a n-type $Al_{0.5}In_{0.5}P$ current blocking layer 9, and 20 nm of a none-doped GaAs cap layer 19 (hereinafter, referred to as i-GaAs layer).

Here, an epitaxial wafer was taken out.

In the first process step, the resonator had a length (sum length of double heterojunction 8 and etching stop layer 24) of 384 nm so that the vertical resonator type light-emitting devise 20 had an emission length of 650 nm. Specifically, the n-$Al_{0.5}In_{0.5}P$ clad layer 4 was of 122 nm and the p-type $Al_{0.5}In_{0.5}P$ clad layer 6 was of 207 nm.

Next, in the second process step, a region other than the GaAs cap layer 19 disposed above an opening portion 9a of the current blocking layer 9 was masked with a resist film and the i-GaAs cap layer 19 above the opening portion of the current blocking layer 9 was etched using an etching agent consisting of ammonia, peroxide water. Next, the $Al_{0.5}In_{0.5}P$ current blocking layer 9 was etched using an etching agent of diluted hydrochloric acid to form the opening portion of the current blocking layer 9. During this process, the i-GaAs cap layer 19 and the etching stop layer 24 were not etched. Thereafter, the GaAs cap layer 19 was etched using the etching agent of ammonia, and peroxide water and thereby cleaned. In this step, a surface of the current blocking layer 9 under the i-GaAs cap layer 19 was oxidized to raise its resistance. In this case, the surface of the current blocking layer 9 remained flat without surface irregularity. According to the vertical resonator type light-emitting device of the Example, an electric current is confined effectively by a difference in band gap of the pn junction created with the current blocking layer 9 inserted and by a surface oxide film of the current blocking layer 9.

In the third process step, the buried epitaxial layers were re-grown onto the current blocking layer 9 formed with the opening portion. In this second-time growth, the MOCVD was used as same as in the first-time growth to grow in order a Bragg reflector layer of 1020 nm in thickness consisting of p-type $Al_{0.45}Ga_{0.55}As$ (45 nm)/AlAs (52.5 nm) as a second reflector layer 10 and a p-type GaAs contact layer 11 of 100 nm in thickness.

In the fourth process step, the substep of forming an electrode (Au/AuSbZn) 17 of 800 nm onto the epitaxially grown surface and an electrode (AuGeNi alloy) 16 of 200 nm on the substrate underside, the substep of forming a passivation film 12, and the substep of dicing were carried out. A chip of resonator type light-emitting device 20 was obtained.

The chip had a size of 320 μm×320 μm and the light emitting area had a diameter of 80 μm. The chip was mounted using a silver paste on a TO-18 stem.

Example 2

A vertical resonator type light-emitting device 20 of Example 2 was fabricated in the same manner as in Example 1 except that the n-type $Al_{0.5}In_{0.5}P$ layer as its current blocking layer 9 was 50 nm in thickness.

Example 3

A vertical resonator type light-emitting device 20 of Example 3 was fabricated in the same manner as in Example 1 except that the n-type $Al_{0.5}In_{0.5}P$ layer as its current blocking layer 9 was 25 nm in thickness.

Example 4

A vertical resonator type light-emitting device 20 of Example 4 was fabricated in the same manner as in Example 1 except that the n-type $Al_{0.5}In_{0.5}P$ layer as its current blocking layer 9 was 10 nm in thickness.

Example 5

A vertical resonator type light-emitting device 20 of Example 5 was fabricated in the same manner as in Example 1 except that the current blocking layer 9 was $Al_{0.5}In_{0.5}P$ layer of not n-type but p-type and that the p-type $In_{0.5}Ga0.5P$ etching stop layer 24 was 5 nm in thickness.

Comparative Examples will be explained next.

Comparative Example 1

As Comparative Example 1, a vertical resonator type light-emitting device of Comparative Example 1 was fabricated in the same manner as in Example 1 except that the current blocking layer 9 was 200 nm in thickness.

Comparative Example 2

Figure 5:
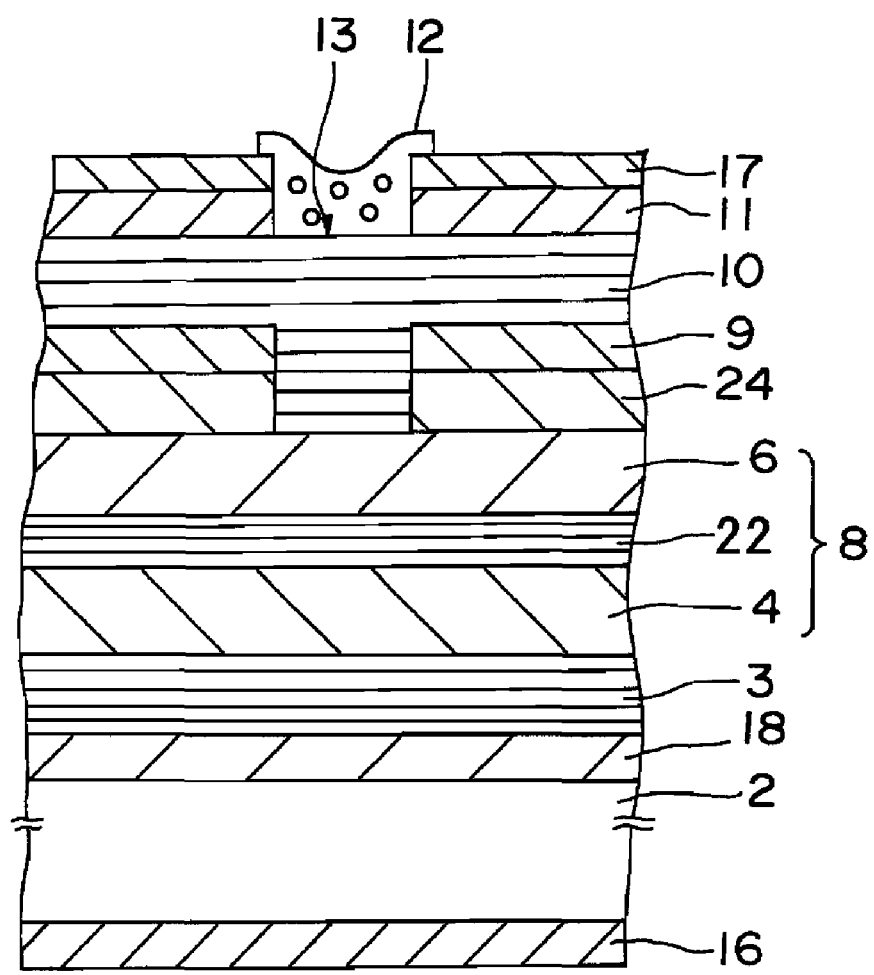
FIG. 5 is a cross sectional view illustrating the structure of a vertical resonator type light-emitting device in Comparative Example.

As Comparative Example 2, a vertical resonator type light-emitting device of Comparative Example 2 was fabricated in the same manner as in Example 1 except that the etching stop layer 24 was made of i-GaAs. Then, the etching stop layer 24 was removed together with the i-GaAs cap layer by etching (Refer to FIG. 5).

Comparative Example 3

As Comparative Example 3, a vertical resonator type light-emitting device of Comparative Example 3 was fabricated in the same manner as in Example 1 except that the current blocking layer 9 was an n-type $In_{0.5}Ga_{0.5}P$ layer of 100 nm in thickness.

Comparative Example 4

As Comparative Example 4, a vertical resonator type light-emitting device of Comparative Example 4 was fabricated in the same manner as in Example 1 except that the current blocking layer 9 had an n-type $Al_{0.5}Ga_{0.5}P$ layer of 10 nm, an n-type GaAs layer of 5 nm and an n-type $In_{0.5}Ga_{0.5}P$ layer of 5 nm which were deposited in turn.

Next, the emission properties of vertical resonator type light-emitting devices 20 of Examples will be explained.

Table 1 shows the emission output power (mW), the forward voltages (V), the cutoff frequencies (MHz) and the yields (%) of the vertical resonator type light-emitting devices 20 of Examples 1 to 5 and Comparative Examples 1 to 4. The properties of forward voltage (V) and cutoff frequency (MHz) were measured with the vertical resonator type light-emitting device 20 mounted on the TO-18 stem.

The emission output power was an output power at an ambient temperature of 25° C. and with a current of 20 mA and measured by a method of collecting light from the vertical resonator type light-emitting device 20 on an integrating sphere. The cutoff frequency was a frequency at which the vertical resonator type light-emitting device 20 becomes no longer responsive to a signal applied thereto as its frequency is increased and by taking an output responded at a low frequency as a reference was measured from a frequency at which its output was reduced to ½ (3 dB). The measurement was made with pulses and the vertical resonator type light-emitting device 20 had an electric current of 20 mA applied thereto. The yield was the percentage such products that are not defective in appearance and electrodes to the fabricated products of vertical resonator type light-emitting device 20.

the light emitting area 13 was deteriorated, the peal off of the electrode 17 was easily occurred thereby resulting a reduction in the yield.

The vertical resonator type light-emitting device in Comparative Example 2, in which the etching stop layer 24 is

TABLE 1

| | Current Blocking Layer | | Current Blocking Layer | | Emission Output Power (mW) | Forward Voltage (V) | Cutoff Frequency (MHz) | Yield (%) |
|---|---|---|---|---|---|---|---|---|
| | Composition | Thickness (nm) | Composition | Thickness (nm) | | | | |
| Example 1 | n-type $Al_{0.5}In_{0.5}P$ | 100 | $In_{0.5}Ga_{0.5}P$ | 10 | 2.51 | 2.29 | 81.2 | 62 |
| Example 2 | | 50 | | | 2.51 | 2.15 | 80.1 | 74 |
| Example 3 | | 25 | | | 2.54 | 2.06 | 78.6 | 84 |
| Example 4 | | 10 | | | 2.5 | 2.05 | 82.6 | 91 |
| Example 5 | p-$Al_{0.5}In_{0.5}P$ | 10 | | 5 | 2.52 | 2.07 | 82.1 | 90 |
| Comparative Example 1 | n-$Al_{0.5}In_{0.5}P$ | 200 | $In_{0.5}Ga_{0.5}P$ | Etching Removed | 2.5 | 2.45 | 80.1 | 20 |
| Comparative Example 2 | n-$Al_{0.5}In_{0.5}P$ | 100 | GaAs | 10 | 0.51 | 2.90 | 110.2 | — |
| Comparative Example 3 | n-$In_{0.5}Ga_{0.5}P$ | 100 | $In_{0.5}Ga_{0.5}P$ | | 0.39 | 1.80 | 60 | — |
| Comparative Example 4 | n-$Al_{0.5}In_{0.5}P$/ GaAs/ n-$In_{0.5}Ga_{0.5}P$ | 10/5/5 | | | 1.7 | 1.94 | 64.9 | — |

As is apparent from Table 1, when the thickness of the n-type blocking layer 9 in the vertical resonator type light-emitting device 20 is varied to 100 nm, 50 nm, 25 nm and 10 nm, high output power of 2.51 mW, 2.51 mW, 2.54 mW and 2.5 mW are obtained, respectively. The forward voltage then became 2.29 V, 2.15 V, 2.06 V and 2.05 V, respectively. The smaller in thickness of the current blocking layer 9, the lower forward voltage was obtained. Especially, as shown in Examples 3 and 4, the lower forward voltage was obtained when the thickness of the current blocking layer 9 is reduced to 25 nm or less. In Examples 1 to 4, the cutoff frequency values of 81.2 MHz, 80.1 MHz, 78.6 MHz and 82.6 MHz were obtained, respectively. These also indicate a good response speed of the device.

As is apparent from Table 1, the vertical resonator type light-emitting device 20 of Example 5 which substitutes p-type for the n-type of Example 4 for the current blocking layer 9 has the emission output power of 2.51 mW, the forward voltage of 2.07 V and the cutoff frequency of 82.6 MHz. These properties achieved equivalent to those in Example 4. Thus, it has been found that since the surface of the p-type current blocking layer 9 was oxidized, the favorable current blocking capability was realized even if used the p-type material that failed to obtain a current blocking effect in the former case.

The vertical resonator type light-emitting devices in Examples 1 to 5 having yields of 62%, 74%, 84%, 91% and 90%, respectively, and it has been found that as the blocking layer 9 is thinned in thickness, the yield is improved.

As is apparent from Table 1, the vertical resonator type light-emitting device in Comparative Example 1 which uses the current blocking layer 9 as thick as 200 nm had an emission output power of 2.5 mW, a forward voltage of 2.45 V, a cutoff frequency of 81.2 MHz, and a yield of 20%. The fact that the forward voltage is higher and the yield is lower than in the Examples is due to the larger thickness of the current blocking layer 9. Thus, as the current blocking layer 9 is thickened, it has been found that the light emitting area 13 tended to be formed on its periphery with a surface irregularity. As the adherence of the electrode 17 formed to surround made of GaAs, had the emission output power as low as 0.51 mW, a forward voltage as high as 2.9 V and the cutoff frequency of 110.2 MHz. The etching stop layer was the GaAs layer. When the GaAs layer is removed, the current blocking layer 9 and also the second clad layer 6 were oxidized. Noting that this oxidized second clad layer 6 had provided to be a re-growth surface. It is estimated that the satisfactory pn junction becomes hardly formed. This caused the higher forward voltage and reduction of the current confinement effect than those of Examples, thereby resulting a reduction of the emission output power.

The vertical resonator type light-emitting device in Comparative Example 3 which substitutes n-type $In_{0.5}Ga_{0.5}P$ for n-type $Al_{0.5}In_{0.5}P$ of Example 1 for the current blocking layer 9 has the emission output power as low as 0.39 mW, the forward voltage as low as 1.8 V and the cutoff frequency of 60 MHz.

In the vertical resonator type light-emitting device in Comparative Example 4, the n-type $Al_{0.5}In_{0.5}P$ of Example 1 was substituted with 10 nm of $Al_{0.5}In_{0.5}P$, 5 nm of GaAs and 5 nm of n-type $In_{0.5}Ga_{0.5}P$ deposited in order to form the current blocking layer 9. It had an emission output as low as 1.7 mW, a forward voltage as low as 1.94 V and a cutoff frequency of 64.9 MHz.

From these results, it is seen that in Comparative Examples 3 and 4, the current blocking layer using the n-type $In_{0.5}Ga_{0.5}P$ which is oxidation resistant is hard to be oxidized at its surface. Its forbidden band gap was small, too, and hence the current blocking effect was reduced. Since the current confinement effect is thus limited, the forward voltage is lower and the cutoff frequency obtained in the level of 60 MHz. The high response speed of Comparative Example 3 compared to that of Examples was not obtained.

Cross sections of the vertical resonator type light-emitting devices 20 fabricated in Examples and Comparative Examples were observed using the secondary ion mass spectrometry (SIMS).

FIGS. 6 and 7 are graphs illustrating results of secondary ion mass spectrometry taken for a vertical resonator type light-emitting device of Example 1 in the direction of a depth from its surface, showing those in a region across its current blocking layer and those in a region across an opening portion of the current blocking layer, respectively. Likewise, FIGS. 8 and 9 are graphs illustrating results of secondary ion mass spectrometry taken for a vertical resonator type light-emitting device of Comparative Example 2 in the direction of a depth from its surface, showing those in a region across its current blocking layer and those in a region across an opening portion of the current blocking layer, respectively. In each graph, the abscissa axis represents the depth from the surface of epitaxial growth while the ordinate axes on the left and right hand sides represent the oxygen concentration (atoms/cm$^3$) and count number (cps) of arsenic (As) and phosphorus (P), respectively.

As is apparent from FIGS. 6 and 8, it is seen that the oxygen concentration, indicated by the downward arrow, at an interface between the current blocking layer 9 and the reflector layer 10 is around $1.5\times10^{20}$ atoms/cm$^3$ higher than those in the reflector layer 10 and clad layer 6 inside, indicating that the current blocking layer 9 consisting of n-type Al$_{0.5}$In$_{0.5}$P in Example 1 and Comparative Example is oxidized.

As is apparent from FIG. 7, it is seen that the oxygen concentration, indicated by the downward arrow, at an interface between the reflector layer 10 and the etching stop layer 24 is about $1\times10^{18}$ atoms/cm$^3$ slightly higher than those in the reflector layer 10 and clad layer 6 inside, indicating that surface oxidation of the etching stop layer 24 in Example 1 is restrained.

On the other hand, it is seen from FIG. 9 that the oxygen concentration, indicated by the downward arrow, at an interface between the reflector layer 10 and the second clad layer 6 is as high as about $1\times10^{20}$ atoms/cm$^3$, indicating that the surface of the clad layer 6 in Comparative Example 2 is oxidized as is the current blocking layer 9 (see FIG. 8).

For the above-mention oxygen concentration at an interface between epitaxial grown layers, similar results were obtained in other Examples 2 to 5. The reverse breakdown voltages of the vertical resonator type light-emitting devices 20 in Examples 1 to 5 were around 15 V. Since oxidation is not occurred about at an interface between the p-type In$_{0.5}$Ga$_{0.5}$P layer as an Al-free etching stop layer 24 and the second reflector layer 10 grown thereon epitaxially, it has thus been found that the forward voltage is prevented from being higher.

According to the Examples and Comparative Examples above, it is found that the vertical resonator type light-emitting device 20 in Examples 1 to 5 has been obtained with the higher output power and the lower forward voltage.

The present invention is not limited to the vertical resonator type light-emitting device 20 as described in the Examples above and may be of an alternative light emitting structure, and allows various modifications within the scope of the invention set forth in the appended claims, as to such as the thickness of a vertical resonator type light-emitting device and the size of such a device chip varied in accordance with its output power, emission wavelength and output power as desired, which should, needless to say, fall within the scope of the invention.

What is claimed is:

1. A light-emitting device, comprising:
   a substrate;
   a light-emitting layer formed over said substrate;
   an etching stop layer formed over said light-emitting layer; and
   a current blocking layer formed on said etching stop layer, the current blocking layer including a surface oxide layer formed substantially only on a surface of said current blocking layer by oxidizing only the surface of said current blocking layer,
   wherein said etching stop layer has a composition of Al$_x$Ga$_y$In$_{1-x-y}$P, where $0\leq x\leq 0.1$, $0\leq y\leq 1$ and $0\leq x+y\leq 1$, or In$_y$Ga$_{1-y}$, where $0\leq y\leq 1$, and
   wherein said current blocking layer has a composition of Al$_x$Ga$_y$In$_{1-x-y}$P, where $0.3\leq x\leq 1$, $0\leq y\leq 1$ and $0\leq x+y\leq 1$, and has a buried structure,
   wherein a portion of said current blocking layer has an oxygen concentration higher than that of said light-emitting layer, and
   wherein said current blocking layer has a thickness of not less than 5 nm and not more than 100 nm.

2. The light-emitting device as set forth in claim 1, wherein at least the portion of said current blocking layer has an oxygen concentration of not less than $1\times10^{20}$ atoms/cm$^3$.

3. The light-emitting device as set forth in claim 1, wherein a surface area of said etching stop layer where said current blocking layer is opened has an oxygen concentration of not more than $1\times10^{19}$ atoms/cm$^3$.

4. The light-emitting device as set forth in claim 2 or 3, wherein said current blocking layer has an oxygen concentration at least 100 times that of a surface area of said etching stop layer where said current blocking layer is opened.

5. The light-emitting device as set forth in claim 1, wherein the light-emitting device further has a resonator structure.

6. The light-emitting device as set forth in claim 1, wherein said light-emitting layer includes an active layer having a quantum well structure.

7. The light-emitting device as set forth in claim 1, wherein a reflector layer is provided between said substrate and said light-emitting layer.

* * * * *